(12) United States Patent
Jyousaka et al.

(10) Patent No.: US 8,135,487 B2
(45) Date of Patent: Mar. 13, 2012

(54) TEMPERATURE SETTING METHOD AND APPARATUS FOR A THERMAL PROCESSING PLATE

(75) Inventors: Megumi Jyousaka, Koshi (JP); Masahide Tadokoro, Koshi (JP); Yoshitaka Konishi, Koshi (JP); Shinichi Shinozuka, Koshi (JP); Kunie Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 890 days.

(21) Appl. No.: 12/103,276

(22) Filed: Apr. 15, 2008

(65) Prior Publication Data
US 2008/0257496 A1 Oct. 23, 2008

(30) Foreign Application Priority Data
Apr. 20, 2007 (JP) .................................. 2007-111796

(51) Int. Cl.
G06F 19/00 (2011.01)
H01L 21/302 (2006.01)
H01L 21/461 (2006.01)
(52) U.S. Cl. ..................... 700/121; 438/714; 438/715
(58) Field of Classification Search .............. 700/21, 700/121; 427/240, 331; 438/714–716, 734, 438/735, 738
See application file for complete search history.

(56) References Cited

U.S. PATENT DOCUMENTS

| | | | | |
|---|---|---|---|---|
| 5,824,455 A | * | 10/1998 | Komatsu et al. | 438/710 |
| 5,863,706 A | * | 1/1999 | Komatsu et al. | 438/724 |
| 5,962,194 A | * | 10/1999 | Komatsu et al. | 430/394 |
| 5,981,001 A | * | 11/1999 | Komatsu et al. | 427/557 |
| 6,025,115 A | * | 2/2000 | Komatsu et al. | 430/396 |
| 6,402,509 B1 | | 6/2002 | Ookura et al. | |
| 6,644,965 B2 | | 11/2003 | Ookura et al. | |
| 7,488,127 B2 | | 2/2009 | Ogata et al. | |
| 7,862,966 B2 | * | 1/2011 | Ogata et al. | 430/30 |
| 7,867,673 B2 | * | 1/2011 | Ogata et al. | 430/30 |
| 7,897,897 B2 | * | 3/2011 | Jyousaka et al. | 219/482 |
| 7,957,828 B2 | * | 6/2011 | Tadokoro et al. | 700/121 |
| 2004/0144488 A1 | * | 7/2004 | Shoya et al. | 156/345.24 |

(Continued)

FOREIGN PATENT DOCUMENTS

JP 11-274030 10/1999

(Continued)

OTHER PUBLICATIONS

El-Awady, K.; Schaper, C.D.; Kailath, T., "Programmable Thermal Processing Module for Semiconductor Substrates", Jul. 2004, IEEE Transactions on Control Systems Technology, vol. 12, No. 4.*

(Continued)

*Primary Examiner* — Kakali Chaki
*Assistant Examiner* — Kelvin Booker
(74) *Attorney, Agent, or Firm* — Oblon, Spivak, McClelland, Maier & Neustadt, L.L.P.

(57) ABSTRACT

A temperature setting method of the present invention includes the steps of: measuring states of an etching pattern within the substrate for a substrate for which a series of photolithography processing including thermal processing and an etching treatment thereafter have been finished; calculating temperature correction values for regions of a thermal processing plate from measurement result of the states of the etching pattern within the substrate using a function between correction amounts for the states of the etching pattern and the temperature correction values for the thermal processing plate; and setting the temperature for each of the regions of the thermal processing plate by each of the calculated temperature correction values.

11 Claims, 7 Drawing Sheets

U.S. PATENT DOCUMENTS

| | | | | |
|---|---|---|---|---|
| 2007/0231975 A1* | 10/2007 | Asou | ............................. | 438/151 |
| 2007/0232080 A1* | 10/2007 | Asou | ............................. | 438/781 |
| 2009/0239352 A1* | 9/2009 | Kitagawa et al. | ............. | 438/439 |

FOREIGN PATENT DOCUMENTS

| | | |
|---|---|---|
| JP | 2001-143850 | 5/2001 |
| JP | 2002-190446 | 7/2002 |
| JP | 2006-222354 | 8/2006 |
| JP | 2006-228816 | 8/2006 |
| WO | WO 2006/085527 A1 | 8/2006 |
| WO | WO 2007/032369 A1 | 3/2007 |
| WO | WO 2007/032370 A1 | 3/2007 |
| WO | WO 2007/032372 A1 | 3/2007 |

OTHER PUBLICATIONS

Ho, W.K.; Tay, A.; Zhou, Y.; and Yang, K., "In Situ Fault Detection of Wafer Warpage in Microlithography", Aug. 2004, IEEE Transactions on Semiconductor Manufactoring, vol. 17, No. 3.*

Menon, L.; Ram, K.B.; Patibandla, S.; Aurongzeb, D.; Holtz, M.; Yun, J.; Kuryatkov, V.; and Zhu, K., "Plasma Etching Transfer of a Nanoporous Pattern on a Generic Substrate", 2004, Journal of the Electrochemical Society, 151, (7), C492-C494.*

Tay, A.; Ho, W.K.; and Hu, N., "An In Situ Approach to Real-Time Spatial Control of Steady-State Wafer Temperature During Thermal Processing in Microlithography", Feb. 2007, IEEE Transactions on Semiconductor Manufacturing, vol. 20, No. 1.*

Tay, A.; Ho, W.K.; Hu, N.; and Chen, X., "Estimation of Wafer Warpage Profile During Thermal Processing in Microlithography", Jul. 2005, American Institute of Physics, Review of Scientific Instruments, 76, 075111.*

Zhang, Q.; Tang, C.; Cain, J.; Hui, A., Hsieh, T.; Maccrae, N.; Singh, B.; Poolla, K.; Spanos, C.J., "Across-Wafer CD Uniformity Control Through Lithography and Etch Process: Experimental Verification", 2007, SPIE Advanced Lithography, vol. 6518-77.*

U.S. Appl. No. 11/816,191, filed Aug. 14, 2007, Megumi Jyousaka, et al.

Japanese Office Action issued Jun. 21, 2011, in Patent Application No. 2007-111796 (with English-language translation).

* cited by examiner

FIG.6
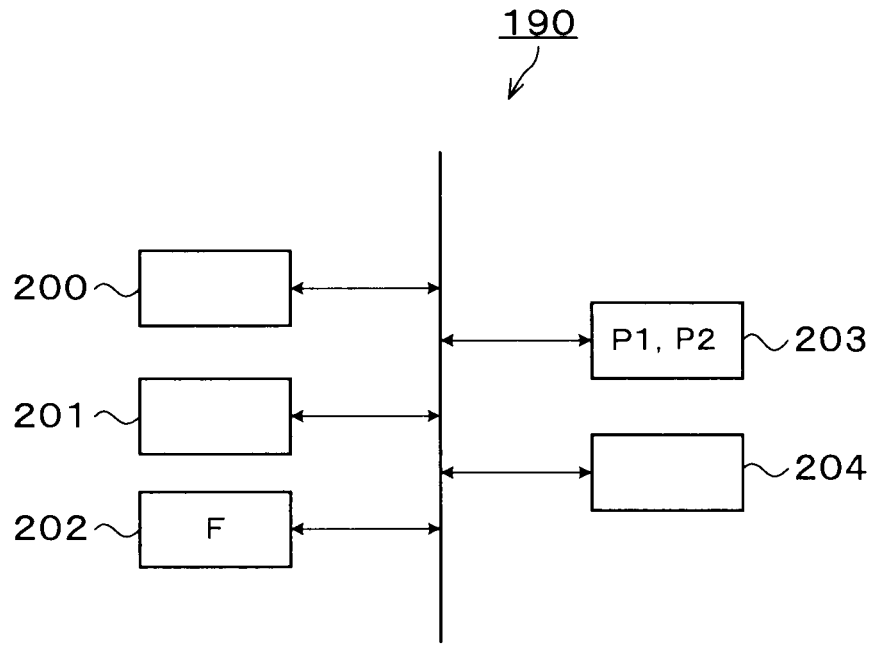
FIG.7
$$F = \begin{Bmatrix} f_{11}, f_{12}, & \cdots & f_{1m} \\ f_{21}, f_{22}, & \cdots & f_{2m} \\ \vdots & \ddots & \vdots \\ f_{n1}, f_{n2}, & \cdots & f_{nm} \end{Bmatrix}$$
FIG.8
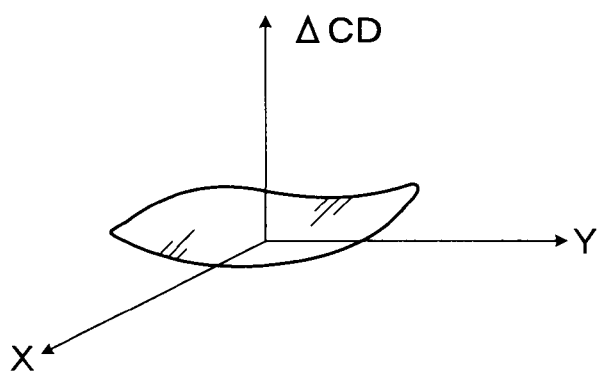

TEMPERATURE SETTING METHOD AND APPARATUS FOR A THERMAL PROCESSING PLATE

BACKGROUND OF THE INVENTION

1. Field of the Invention

The present invention relates to a temperature setting method for a thermal processing plate, a temperature setting apparatus for a thermal processing plate, and a computer-readable storage medium.

2. Description of the Related Art

In a photolithography process in manufacturing, for example, a semiconductor device, for example, resist coating treatment of applying a resist solution onto a processing film on a wafer to form a resist film, exposure processing of exposing the resist film into a predetermined pattern, heat-processing of accelerating the chemical reaction in the resist film after exposure (post-exposure baking), and developing treatment of developing the exposed resist film are performed in sequence, so that a predetermined resist pattern is formed on the wafer by the series of photolithography processing. The wafer is then subjected to etching treatment in which a predetermined etching pattern is formed in the processing film.

For example, the heat-processing such as the aforementioned post-exposure baking is usually performed in a heat-processing unit. The heat-processing unit includes a thermal plate mounting and heating the wafer thereon. The thermal plate incorporates a heater generating heat, for example, by power feeding, and the thermal plate is adjusted to a predetermined temperature by the heat generation by the heater.

The thermal processing temperature in the above-described heat-processing greatly affects, for example, the line width of the resist pattern formed on the wafer. Hence, to strictly control the temperatures within the wafer during heating, the thermal plate of the above-described heat-processing unit is divided into a plurality of regions, and an independent heater is embedded in each of the regions to adjust the temperature for each of the regions.

Further, it is known that if the temperature adjustment is performed at the same set temperature for all of the regions of the thermal plate, the temperatures within the wafer on the thermal plate vary due to the difference in heat resistance of the regions, resulting in variations in line width of the resist pattern. Therefore, the set temperatures of the regions of the thermal plate are temperature-corrected (temperature offset), and the temperature correction values for the regions are set to make uniform the temperatures within the wafer mounted on the thermal plate (Japanese Patent Application Laid-open No. 2001-143850).

However, even if the temperature correction values are set to uniform the temperatures within the wafer as in the prior art, actually, sufficiently uniform line widths of the resist pattern have not been formed. Hence, it is proposed that the temperature correction of the thermal plate is performed to bring the average value of the actually formed line widths of the resist pattern within the wafer to a predetermined target line width value (Japanese Patent Application Laid-open No. 2006-222354).

SUMMARY OF THE INVENTION

However, even if the average value of the line widths of the resist pattern within the wafer is brought to the predetermined target line width as described above, the final line widths of a processing film after etching treatment may vary within the wafer. The variations in final line width of the processing film result in failure to form a desired circuit pattern.

The present invention has been developed in consideration of the above points, and its object is to make states such as line widths of an etching pattern after etching treatment uniform within a substrate.

The present invention to achieve the above object is a temperature setting method for a thermal processing plate mounting and thermally processing a substrate thereon, the thermal processing plate being divided into a plurality of regions, and a temperature being capable of being set for each of the regions, and a temperature correction value for adjusting an in-plane temperature of the thermal processing plate being capable of being set for each of the regions of the thermal processing plate The temperature setting method of the present invention includes the steps of: measuring states of an etching pattern within the substrate for a substrate for which a series of photolithography processing including the thermal processing on the thermal processing plate and an etching treatment thereafter have been finished; calculating the temperature correction values for the regions of the thermal processing plate from measurement result of the states of the etching pattern within the substrate using a function between correction amounts for the states of the etching pattern and the temperature correction values for the thermal processing plate; and setting the temperature for each of the regions of the thermal processing plate by each of the calculated temperature correction values.

According to the present invention, the temperature correction values for the regions of the thermal processing plate are calculated using the function between correction amounts for the states of the etching pattern and the temperature correction values for the thermal processing plate, so that the uniformity within the substrate of the finally formed etching pattern can be increased.

The present invention according to another aspect is a temperature setting apparatus for a thermal processing plate mounting and thermally processing a substrate thereon, the thermal processing plate being divided into a plurality of regions, and a temperature being capable of being set for each of the regions, and a temperature correction value for adjusting an in-plane temperature of the thermal processing plate being capable of being set by the temperature setting apparatus for each of the regions of the thermal processing plate. The temperature setting apparatus of the present invention includes: a data storage unit storing, from states of an etching pattern within the substrate measured for a substrate for which a series of photolithography processing including the thermal processing on the thermal processing plate and an etching treatment thereafter have been finished, a function between correction amounts for the states of the etching pattern and the temperature correction values for the thermal processing plate; and a program storage unit storing a program to calculate the temperature correction values for the regions of the thermal processing plate using the function, and set the temperature for each of the regions of the thermal processing plate by each of the calculated temperature correction values.

The present invention according to another aspect is a computer-readable storage medium storing a program running on a computer of a control unit controlling a temperature setting apparatus to cause the temperature setting apparatus to execute the temperature setting method for a thermal processing plate.

According to the present invention, the uniformity of an etching pattern within the substrate is increased to improve the yields.

BRIEF DESCRIPTION OF THE DRAWINGS

FIG. 6 is a block diagram showing a configuration of a temperature setting apparatus;

FIG. 7 is an explanatory view showing a general formula of a relational model;

FIG. 8 is a schematic diagram showing variations in line width within the wafer in a contour form;

DETAILED DESCRIPTION OF THE INVENTION

Figure 1:
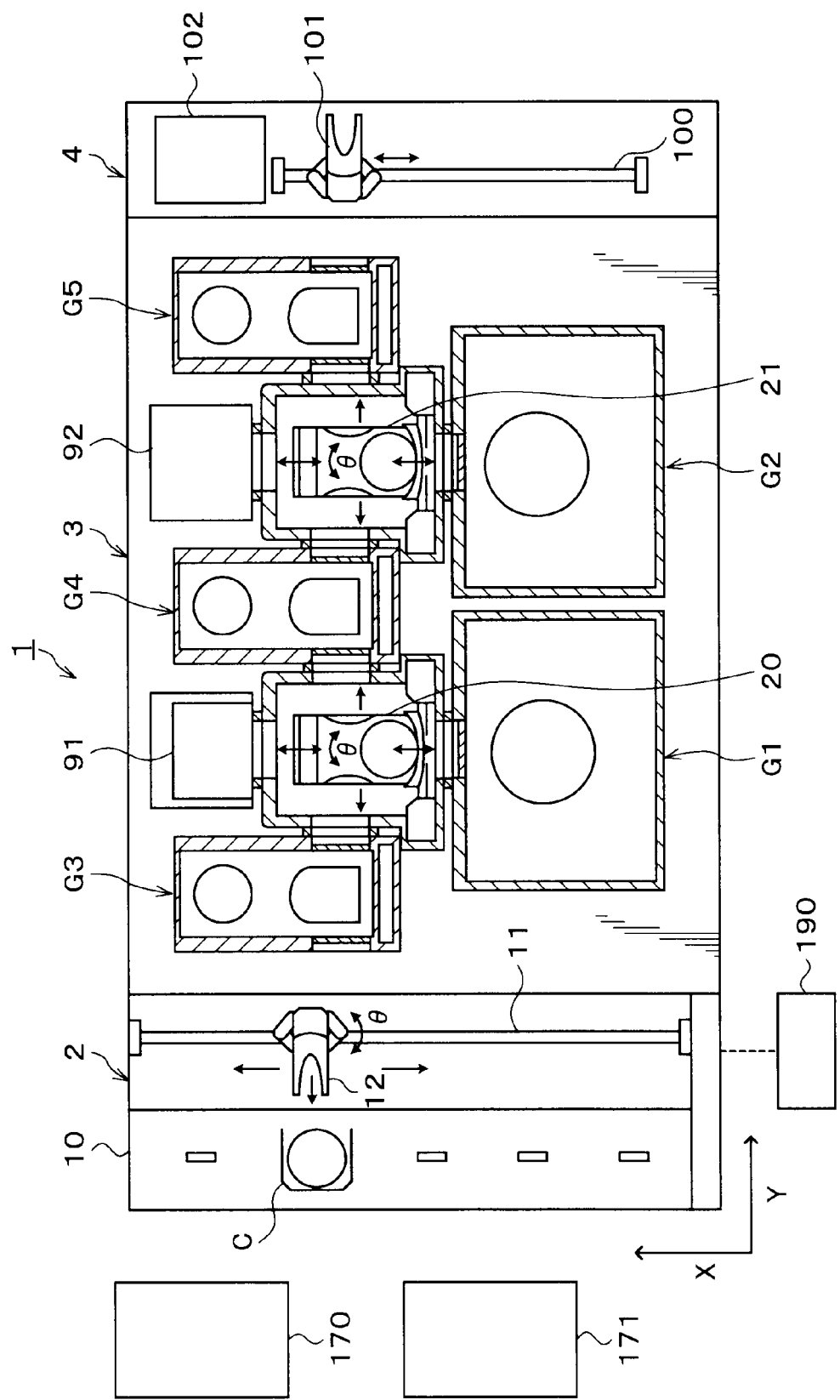
FIG. 1 is a plan view showing the outline of a configuration of a coating and developing treatment system.
Figure 2:
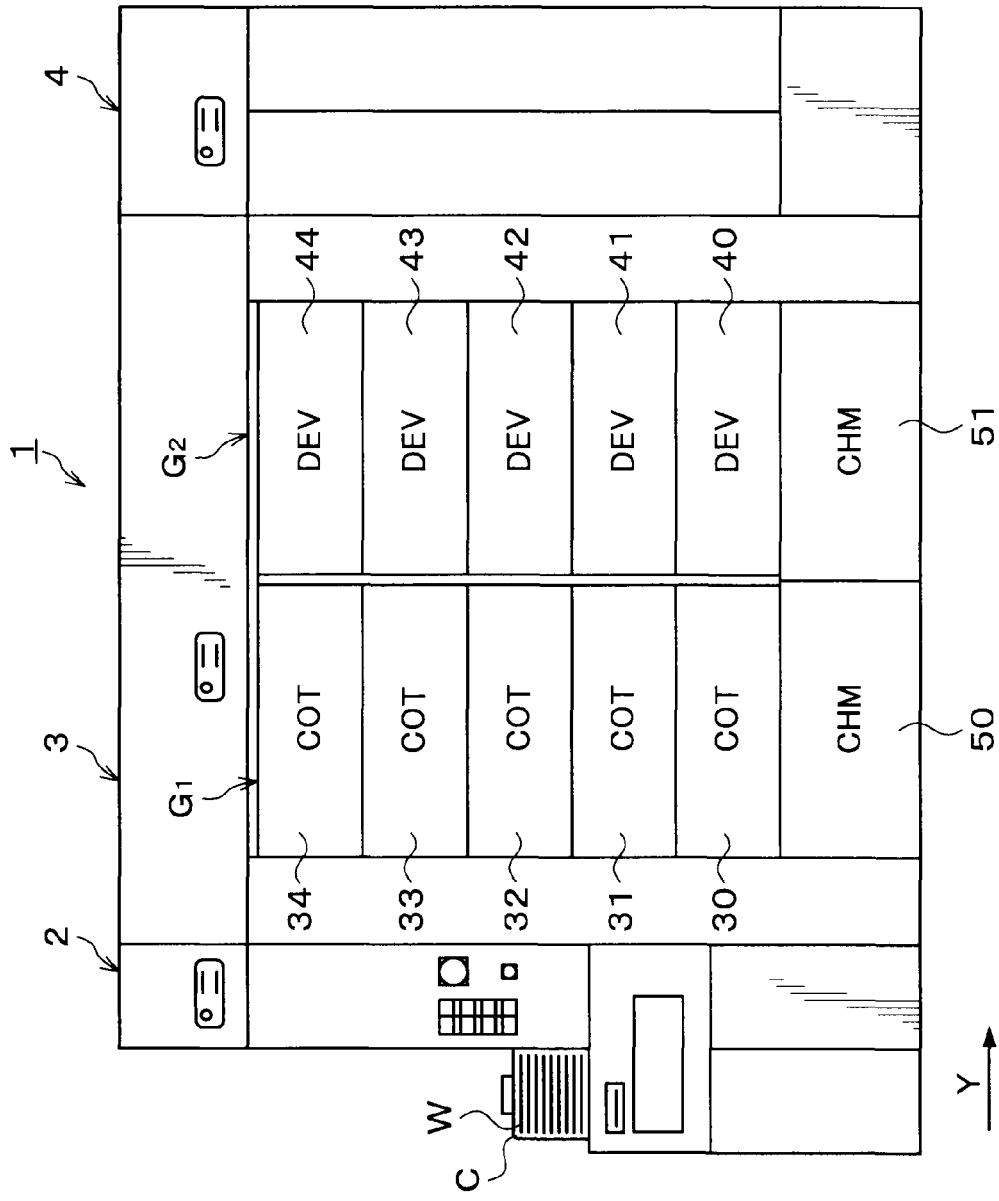
FIG. 2 is a front view of the coating and developing treatment system in FIG. 1.
Figure 3:
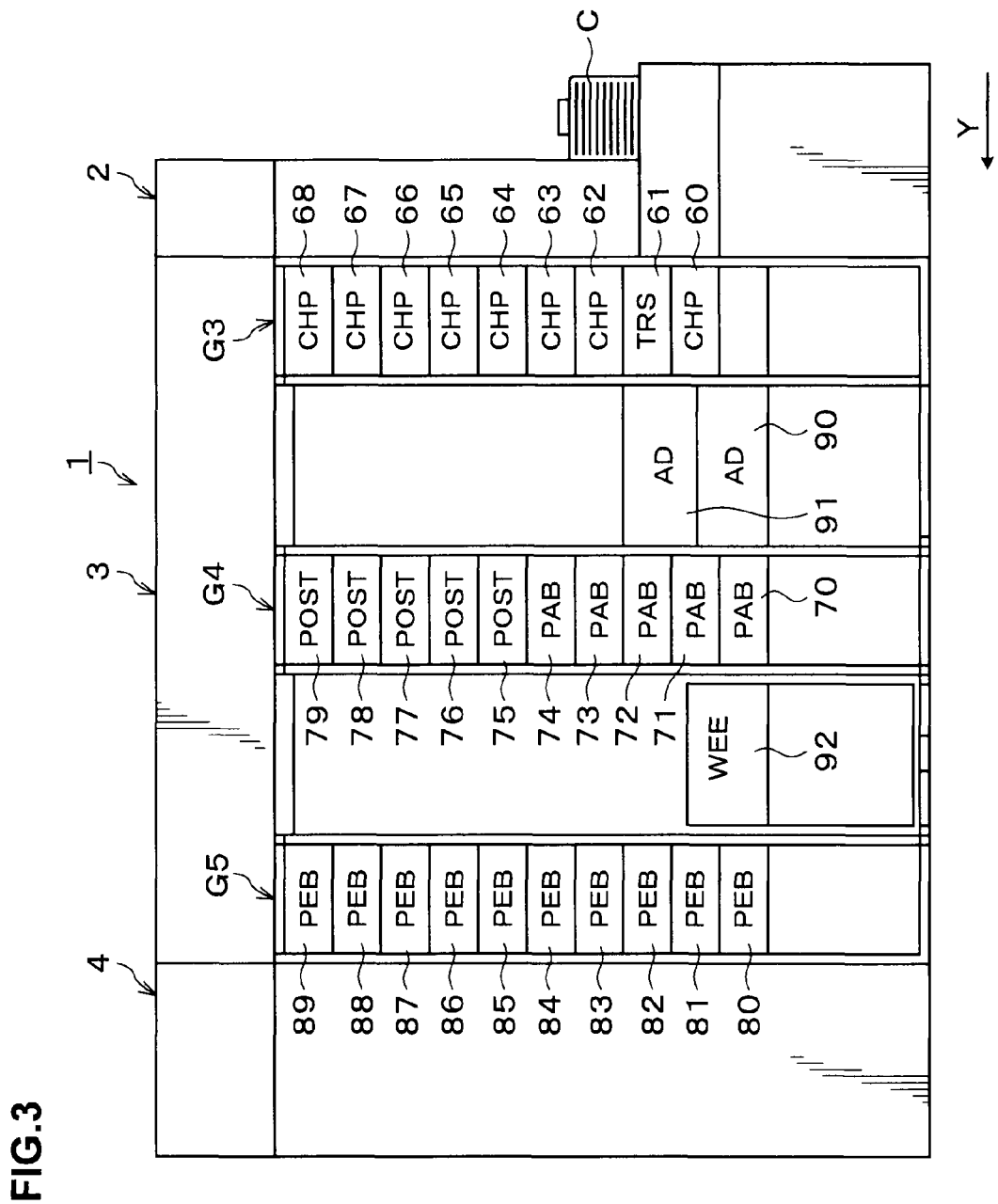
FIG. 3 is a rear view of the coating and developing treatment system in FIG. 1.

Hereinafter, an embodiment of the present invention will be described. FIG. 1 is a plan view showing the outline of a configuration of a coating and developing treatment system 1 including a temperature setting apparatus for a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring a plurality of wafers W as a unit, for example, from/to the outside into/from the coating and developing treatment system 1; a processing station 3 including a plurality of various kinds of processing and treatment units for performing predetermined processing or treatment in a manner of single wafer processing in the photolithography processing; and an interface station 4 for delivering the wafers W to/from a not-shown aligner adjacent to the processing station 3, are integrally connected together.

In the cassette station 2, a cassette mounting table 10 is provided on which a plurality of cassettes C can be mounted in a line in an X-direction (a top-to-bottom direction in FIG. 1). In the cassette station 2, a wafer transfer unit 12 is provided which is movable in the X-direction on a transfer path 11. The wafer transfer unit 12 is also movable in an arrangement direction of the wafers W housed in the cassette C (a Z-direction; the vertical direction), and thus can selectively access the plurality of wafers W in the cassette C. The wafer transfer unit 12 is also rotatable around an axis in the vertical direction (a θ-direction), and can access the processing and treatment units included in a later-described third processing unit group G3 in the processing station 3 and transfer the wafer W to them.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side toward the interface station 4 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side toward the interface station 4 side. Between the third processing unit group G3 and the fourth processing unit group G4, a first transfer unit 20 is provided. The first transfer unit 20 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 21 is provided. The second transfer unit 21 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 30 to 34 each for applying a resist solution onto the wafer W are five-tiered in order from the bottom. In the second processing unit group G2, solution treatment units, for example, developing treatment units 40 to 44 each for supplying a developing solution to the wafer W to develop it are five-tiered in order from the bottom. Further, chemical chambers 50 and 51 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a thermal processing unit 60 for heating and cooling the wafer W, a transition unit 61 for passing the wafer W, and thermal processing units 62 to 68 each for heating and cooling the wafer W, are nine-tiered in order from the bottom.

In the fourth processing unit group G4, for example, a plurality of thermal processing units each for thermally processing the wafer W, for example, pre-baking units 70 to 74 each for heat-processing the wafer W after resist coating treatment, and post-baking units 75 to 79 each for heat-processing the wafer W after developing treatment, are ten-tiered in order from the bottom. Note that each of the pre-baking units 70 to 74 and the post-baking units 75 to 79 has a heating plate and a cooling plate for mounting the wafer W thereon to be capable of both heating and cooling it.

In the fifth processing unit group G5, a plurality of thermal processing units each for thermally processing the wafer W, for example, post-exposure baking units 80 to 89 each for heat-processing the wafer W after exposure are ten-tiered in order from the bottom.

As shown in FIG. 1, on the positive direction side in the X-direction of the first transfer unit 20, a plurality of treatment units are arranged, for example, adhesion units 90 and 91 each for performing hydrophobic treatment on the wafer W being two-tiered in order from the bottom as shown in FIG. 3. As shown in FIG. 1, on the positive side in the X-direction of the second transfer unit 21, for example, an edge exposure processing unit 92 is disposed which selectively exposes only the edge portion of the wafer W to light.

In the interface station 4, for example, a wafer transfer unit 101 moving on a transfer path 100 extending in the X-direction and a buffer cassette 102 are provided as shown in FIG. 1. The wafer transfer unit 101 is movable in the Z-direction and also rotatable in the O-direction, and thus can access the aligner adjacent to the interface station 4, the buffer cassette 102, and the processing and treatment units in the fifth processing unit group G5 and transfer the wafer W to them.

Figure 4:
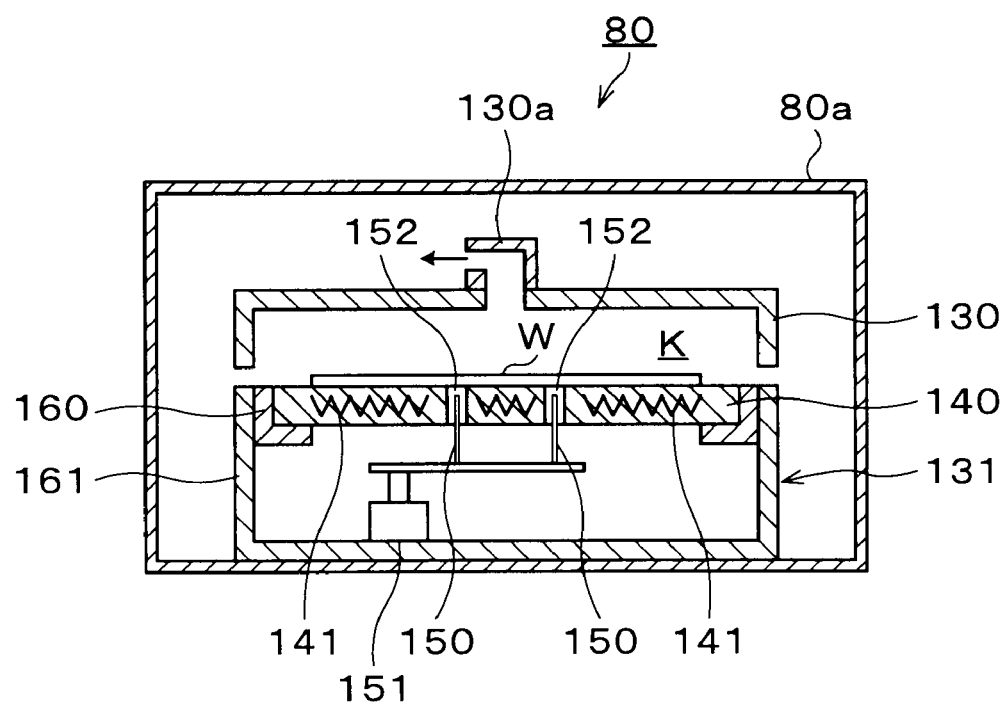
FIG. 4 is an explanatory view of a longitudinal section showing the outline of a configuration of a post-exposure baking unit.

Next, the configuration of the above-described post-exposure baking units 80 to 89 will be described. For example, the post-exposure baking unit 80 has, in a casing 80a as shown in FIG. 4, a lid body 130 that is located on the upper side and vertically movable, and a thermal plate accommodating unit 131 that is located on the lower side and forms a processing chamber K together with the lid body 130.

The lid body 130 has a substantially cylindrical shape with a lower face open. The central portion of the upper surface of the lid body 130 is provided with an exhaust portion 130a. The atmosphere in the processing chamber K is uniformly exhausted through the exhaust portion 130a.

Figure 5:
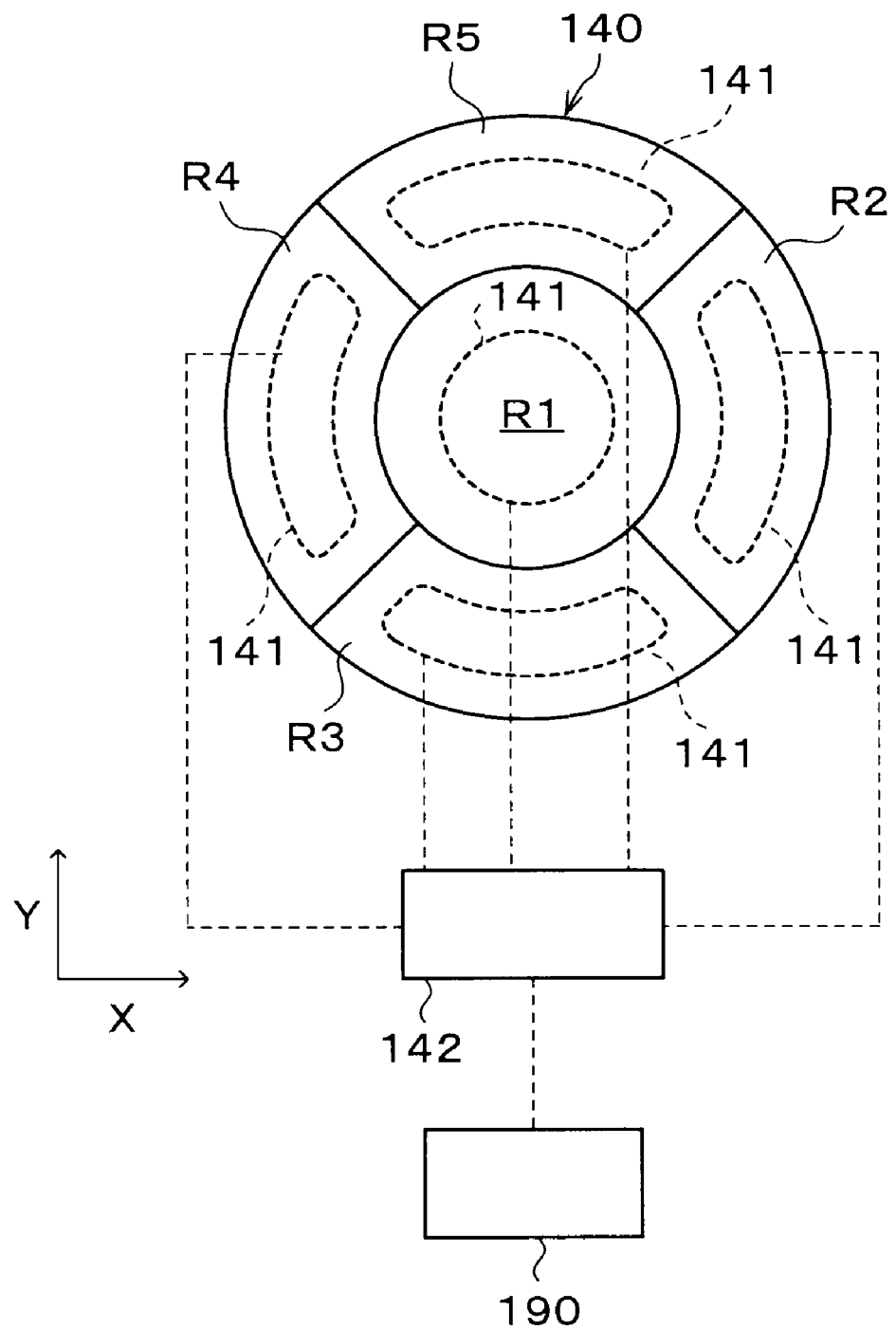
FIG. 5 is a plan view of a configuration of a thermal plate of the post-exposure baking unit.

At the central portion of the thermal plate accommodating unit 131, a thermal plate 140 is provided as a thermal processing plate. The thermal plate 140 is formed in a substantially disk shape. The thermal plate 140 is divided into a plurality of, for example, five thermal plate regions $R_1$, $R_2$, $R_3$, $R_4$ and $R_5$ as shown in FIG. 5. The thermal plate 140 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 141 generating heat by power feeding is individually embedded in each of the thermal plate regions $R_1$ to $R_5$ of the thermal plate 140 and can heat each of the thermal plate regions $R_1$ to $R_5$. The heating value of each of the heaters 141 of the thermal plate regions $R_1$ to $R_5$ is adjusted, for example, by a temperature controller 142. The temperature controller 142 can adjust the heating value of each of the heaters 141 to control the temperature of each of the thermal plate regions $R_1$ to $R_5$ to a predetermined set temperature. The temperature setting in the temperature controller 142 is performed, for example, by a later-described temperature setting unit 190.

As shown in FIG. 4, raising and lowering pins 150 for supporting the lower side of the wafer W and raising and lowering the wafer W are provided below the thermal plate 140. The raising and lowering pins 150 are configured to be vertically movable by means of a raising and lowering drive mechanism 151. Near the central portion of the thermal plate 140, through holes 152 are formed which pass through the thermal plate 140 in its thickness direction. The raising and lowering pins 150 can rise from below the thermal plate 140 and pass through the through holes 152 to project to above the thermal plate 140.

The thermal plate accommodating unit 131 includes an annular supporting member 160 for accommodating the thermal plate 140 and supporting the outer peripheral portion of the thermal plate 140, and a support ring 161 in a substantially cylindrical shape surrounding the outer periphery of the supporting member 160.

Note that the post-exposure baking unit 80 has a not-shown cooling plate, for example, adjacent to the thermal plate 140 and can mount and cool the wafer W thereon. Accordingly, the post-exposure baking unit 80 can perform both heating and cooling.

The configuration of the post-exposure baking unit 81 to 89 is the same as that of the post-exposure baking unit 80, and therefore their description will be omitted.

In the same clean room, for example, with the coating and developing treatment system 1, an etching treatment unit 170 is provided which performs etching treatment on a processing film after photolithography processing as shown in FIG. 1.

In the clean room, a line width measuring unit 171 is provided which measures the line width of an etching pattern formed in the processing film on the wafer W.

In the coating and developing treatment system 1, the following photolithography processing is performed. First of all, unprocessed wafers W are taken out by the wafer transfer unit 12 shown in FIG. 1 one by one from the cassette C on the cassette mounting table 10, and transferred to the processing station 3. The wafer W is transferred to the thermal processing unit 60 included in the third processing unit group G3 in the processing station 3 and temperature-regulated to a predetermined temperature. The wafer W is then transferred by the first transfer unit 20, for example, to the adhesion unit 90 and subjected to adhesion treatment. The wafer W is then transferred by the first transfer unit 20, for example, to the resist coating unit 30, where a resist solution is applied onto the processing film on the wafer W to form a resist film.

After the resist coating treatment, the wafer W is transferred by the first transfer unit 20, for example, to the prebaking unit 71 and subjected to pre-baking. The wafer W is subsequently transferred by the second transfer unit 21 to the edge exposure unit 92 and subjected to edge exposure processing. The wafer W is then transferred by the wafer transfer unit 101 in the interface station 4 to the not-shown aligner, where the wafer is exposed to light. The wafer W is then transferred by the wafer transfer unit 101, for example, to the post-exposure baking unit 80 in the processing station 3.

After transferred into the post-exposure baking unit 80, the wafer W is passed to the raising and lowering pins 150 which have been raised and waiting in advance. Subsequently, the raising and lowering pins 150 are lowered so that the wafer W is mounted and heated on the thermal plate 140. In this event, each of the thermal plate regions $R_1$ to $R_5$ of the thermal plate 140 is set to a predetermined temperature, so that the wafer is heated at a predetermined temperature within a plane. Thus, the wafer W is subjected to heat-processing for a predetermined time. After a lapse of the predetermined time, the wafer W is raised from the thermal plate 140 by the raising and lowering pins 150, with which the heat-processing for the wafer W ends.

After the heat-processing has been finished in the post-exposure baking unit 80, the wafer W is transferred by the second transfer unit 21 to the developing treatment unit 40, where the resist film on the wafer W is developed. After the development, the wafer W is transferred by the second transfer unit 21 to the post-baking unit 75 and subjected to post-baking. The wafer W is then transferred by the first transfer unit 20 to the transition unit 61 and returned to the cassette C by the wafer transfer unit 12, with which a series of photolithography processing ends.

The wafer W is then transferred to the etching treatment unit 170, where the base processing film is etched using the resist pattern as a mask. Thus, an etching pattern is formed in the processing film on the wafer W.

Here, a configuration of the temperature setting apparatus 190 which sets the temperature of the thermal plate 140 of the post-exposure baking unit 80 will be described. For example, the temperature setting apparatus 190 is composed of a general-purpose computer including, for example, a CPU and a memory, and is provided in the cassette station 2 of the coating and developing treatment system 1 as shown in FIG. 1.

The temperature setting apparatus 190 comprises, for example, as shown in FIG. 6, a calculation unit 200 for executing various kinds of programs; an input unit 201 for inputting, for example, various kinds of information for temperature setting; a data storage unit 202 for storing various kinds of information such as a relational model F as a function for calculating a temperature correction value; a program storage unit 203 for storing various kinds of programs for temperature setting; and a communication unit 204 for communicating with the temperature controller 142 to change the temperature setting of the thermal plate 140.

The data storage unit 202 stores the relational model F that is a function between the correction amount for the line width of the etching pattern and the temperature correction value (temperature offset value) for the thermal plate 140. The relational model F indicates the correlation between target correction amounts ΔCD for the line widths within the wafer and temperature correction values ΔT for the thermal plate regions $R_1$ to $R_5$ and satisfies the following relational expression (1).

$$\Delta CD = F \cdot \Delta T \quad (1)$$

Specifically, the relational model F is a matrix of n rows by m columns as shown in FIG. 7 which is expressed using a predetermined coefficient indicating in-plane variations in line width, for example, varying per 1° C.

The relational model F is created, for example, as follows. The photolithography processing and etching treatment are performed for the wafer W, for example, with the temperature setting of one of the thermal plate regions of the thermal plate 140 being raised by 1° C. from the current setting, and the line widths of the resultantly formed etching pattern within the wafer are measured. This line width measurement is performed for each of the thermal plate regions $R_1$ to $R_5$, so that line width measurement is performed five times in total. The line width measurements leads to detection of the line width change amounts of the etching pattern within the wafer when the temperature setting of each of the thermal plate regions is raised by 1° C. The line width change amounts within the wafer are grasped as a curved surface in a contour form within a plane of x, y two dimensions, for example, as shown in FIG. 8, and this curved surface is expressed by a polynomial function and coefficients fk of the polynomial function are elements of the matrix of the relational model F.

The program storage unit 203 stores a calculation program P1 to calculate the temperature correction values ΔT for the thermal plate regions $R_1$ to $R_5$ of the thermal plate 140 from the measurement result of the line widths within the wafer of the etching pattern using the relational model F; a setting change program P2 to change the existing temperature settings of the temperature controller 142 based on the calculated temperature correction values ΔT, and so on. Note that the various programs to realize the temperature setting process may be ones recorded on a recording medium such as a computer-readable CD and installed from the recording medium into the temperature setting apparatus 190.

For example, the calculation program P1 obtains necessary line width correction amounts ΔCD, for example, from the line width measurement result. For example, the measured line widths within the wafer are expressed by the polynomial function, and the coefficients fk of the polynomial function are obtained, and values made by multiplying the coefficients fk by −1 so that the coefficients fk become zero are regarded as the line width correction amounts ΔCD. Then, the calculation program P1 can calculate the temperature correction values ΔT for the thermal plate regions $R_1$ to $R_5$ using the relational model F from the line width correction amounts ΔCD. In this event, the temperature correction values ΔT can be calculated from the line width correction amounts ΔCD by the following expression (2) which is made by deforming the relational expression (1).

$$\Delta T = F^{-1} \cdot \Delta CD \quad (2)$$

Figure 9:
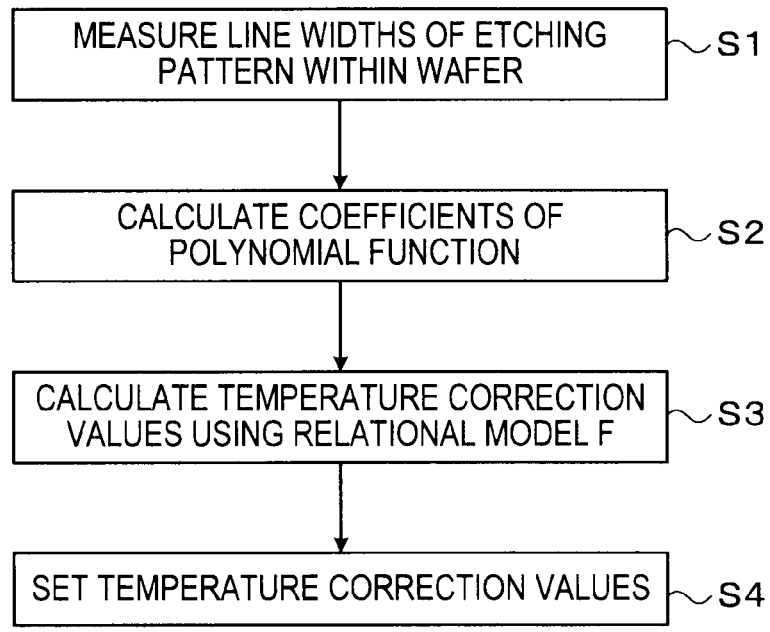
FIG. 9 is a flowchart showing a temperature setting process.

Next, the temperature setting process by the temperature setting apparatus 190 configured as described above will be described. FIG. 9 is a flowchart showing main steps of the temperature setting process.

Figure 10:
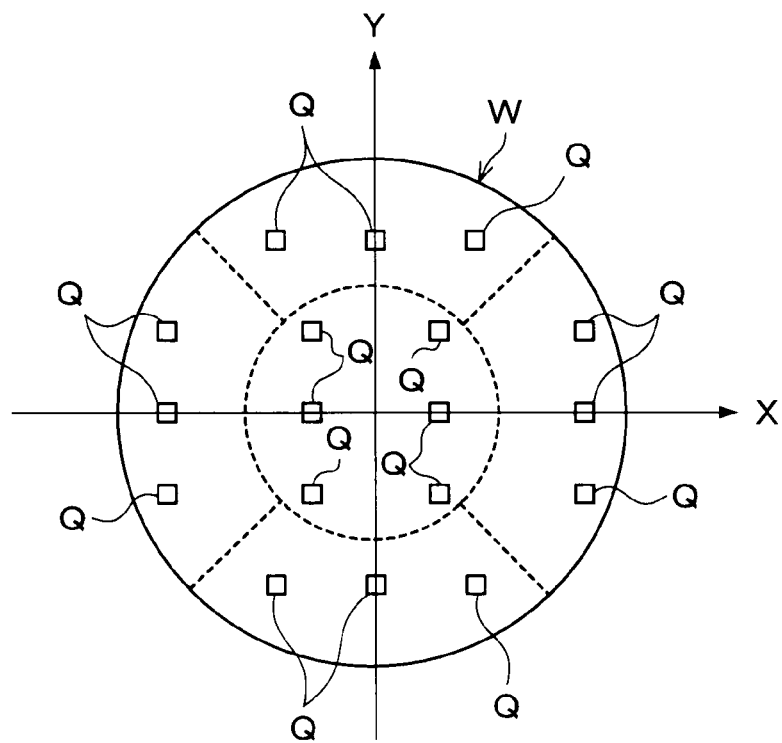
FIG. 10 is an explanatory view showing measurement points of line widths within the wafer.

First of all, the wafer W for which a series of photolithography processing has been performed in the coating and developing treatment system 1 and then etching treatment has been performed in the etching treatment unit 170 is transferred into the line width measuring unit 171. In the line width measuring unit 171, the line widths of the etching pattern formed in the processing film on the wafer W are measured (Step S1 in FIG. 9). In this event, the line widths, for example, at a plurality of measurement points Q within the wafer as shown in FIG. 10 are measured to obtain the line widths over the entire wafer W corresponding to the respective thermal plate regions $R_1$ to $R_5$ of the thermal plate 140.

Subsequently, the line width measurement results within the wafer of the etching pattern are outputted to the temperature setting apparatus 190. In the temperature setting apparatus 190, the coefficients fk when expressing the variations in line width within the wafer by the polynomial function are calculated from the line width measurement results within the wafer (Step S2 in FIG. 9). By bringing the coefficients fk to zero, the variations in line widths within the wafer can be eliminated. Therefore, the line width correction amounts ΔCD made by multiplying the coefficients fk by −1 are calculated. Then, these line width correction amounts ΔCD are substituted into the relational expression (2) so that the temperature correction values ΔT ($\Delta T_1$ to $\Delta T_5$) for the thermal plate regions $R_1$ to $R_5$ are calculated using the relational model F (Step S3 in FIG. 9). This calculation calculates the temperature correction values $\Delta T_1$ to $\Delta T_5$, for example, to bring the coefficients fk in the measured line widths to zero to eliminate the in-plane variations in line width.

Thereafter, information on the temperature correction values $\Delta T_1$ to $\Delta T_5$ is outputted from the communication unit 204 to the temperature controller 142, and the temperature correction values for the thermal plate regions $R_1$ to $R_5$ of the thermal plate 140 in the temperature controller 142 are changed, whereby new set temperatures are set (Step S4 in FIG. 9).

Note that the temperature setting process is realized, for example, by executing the various programs stored in the program storage unit 203 of the temperature setting apparatus 190.

According to the above embodiment, for the wafer W for which a series of photolithography processing and etching treatment have been finished, the line widths of the etching pattern within the wafer are measured, and the temperature correction values ΔT for the thermal plate regions $R_1$ to $R_5$ in the post-exposure baking unit 80 are calculated from the measurement result of the line widths within the wafer using the relational model F. Then, the temperature settings for the regions $R_1$ to $R_5$ of the thermal plate 140 are changed by the temperature correction values ΔT. In this case, the previously obtained function between the line width correction amounts ΔCD for the etching pattern and the temperature correction values ΔT is used to perform temperature setting for the post-exposure baking based on the final etching result, so that the final line widths of the etching pattern can be made uniform within the wafer.

In the above embodiment, the line width change amounts of the etching pattern within the wafer when the temperature of one of the regions of the thermal plate 140 is changed by 1° C. are obtained for each of the thermal plate regions $R_1$ to $R_5$, and those results are expressed in a matrix to create the relational model F. Further, the line width change amounts of the etching pattern within the wafer in each of the thermal plate regions $R_1$ to $R_5$ are expressed by the polynomial function, and the coefficients of the respective terms of the polynomial function are expressed by the matrix to create the relational model F. As a result of this, a relational model F can be created which is relatively simple and highly accurate.

Since the temperature of the post-exposure baking of the photolithography processing greatly affects the final line widths of the etching pattern, the temperatures of the thermal plate 140 of the post-exposure baking unit 80 can be set by the method to strictly control the line widths of the etching pattern, thereby improving the uniformity of the line widths within the wafer.

Though the line width correction amounts ΔCD are calculated from the measurement result of the line width of the etching pattern in the temperature setting apparatus 190 in the above embodiment, the calculation may be performed by another computer and the calculation result of the line width correction amounts ΔCD may be inputted into the temperature setting apparatus 190. In this case, the temperature correction values ΔT are calculated from the line width correction amounts ΔCD, and the new temperature correction values ΔT are set in the temperature setting apparatus 190.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

Though the temperature correction values ΔT are calculated using the function of the relational model F in the above embodiment, another function may be used as long as it is a function between the line width correction amounts ΔCD for the etching pattern and the temperature correction values ΔT for the thermal plate 140.

While the temperature-set thermal plate 140 is divided into five regions in the above embodiment, any number of divisions can be selected. The shapes of the divided regions of the thermal plate 140 can also be arbitrarily selected.

While the above embodiment is an example in which the temperature setting of the thermal plate 140 of the post-exposure baking unit 80 is performed based on the line widths within the wafer of the etching pattern in the above embodiment, the present invention is also applicable to a case of performing the temperature setting of a thermal plate for performing other thermal processing such as pre-baking, post-baking or the like or the temperature setting of a cooling plate of a cooling processing unit for cooling the wafer W.

While the temperature setting of the thermal plate is performed to make the line widths within the wafer of the etching pattern uniform in the above embodiment, the temperature setting of a thermal processing plate may be performed so that the states other than the line widths, such as the angles of the side walls in the groove of the etching pattern (the side wall angles) or the film thicknesses of the etching pattern are uniform within the wafer. In this case, as the line width measuring unit 171, an optical profilometer is used which measures the dimension of the etching pattern using the Scatterometry method. Then, the optical profilometer may be used to measure the side wall angles or the film thicknesses within the wafer of the etching pattern, and the temperature setting of the thermal plate of the pre-baking unit may be performed to make them uniform within the wafer. Alternatively, the temperature setting of the thermal plate of the post-exposure baking unit may be performed to make the line widths uniform from the measurement result of the etching pattern as well as the temperature setting of the thermal plate of the pre-baking unit may be performed to make the side wall angles or the film thicknesses uniform. Furthermore, the present invention is also applicable to temperature setting of the thermal processing plate which thermally processes substrates other than the wafer, such as an FPD (Flat Panel Display), a mask reticle for a photomask, and the like.

The present invention is useful in setting the temperature of a thermal processing plate mounting and thermally processing a substrate thereon.

What is claimed is:

1. A temperature setting method for a thermal processing plate mounting and thermally processing a substrate thereon,
    the thermal processing plate being divided into a plurality of regions, and a temperature being capable of being set for each of the regions, and
    a temperature correction value for adjusting an in-plane temperature of the thermal processing plate being capable of being set for each of the regions of the thermal processing plate, said method comprising the steps of:
    measuring states of an etching pattern within the substrate for a substrate for which a series of photolithography processing including the thermal processing on the thermal processing plate and an etching treatment thereafter have been finished;
    calculating the temperature correction values for the regions of the thermal processing plate from a measurement result of the states of the etching pattern within the substrate using a function relating correction amounts for the states of the etching pattern to the temperature correction values for the thermal processing plate; and
    setting the temperature for each of the regions of the thermal processing plate by each of the calculated temperature correction values.

2. The temperature setting method for a thermal processing plate as set forth in claim 1,
    wherein change amounts of the states of the etching pattern within the substrate when the temperature of one of the regions of the thermal processing plate is changed by 1° C. are obtained for each of the regions, and results thereof are expressed in a matrix to create the function.

3. The temperature setting method for a thermal processing plate as set forth in claim 2,
    wherein the change amounts of the states of the etching pattern within the substrate in each of the regions when the temperature of one of the regions of the thermal processing plate is changed by 1° C. are expressed by a polynomial function, and coefficients of terms of the polynomial function are expressed in a matrix to create the function.

4. The temperature setting method for a thermal processing plate as set forth in claim 1,
    wherein the thermal processing is heat-processing performed after exposure processing and before developing treatment in the photolithography processing.

5. The temperature setting method for a thermal processing plate as set forth in claim 1,
    wherein the state of the etching pattern is at least any one of a line width, a film thickness, and a side wall angle of the etching pattern.

6. A temperature setting apparatus for a thermal processing plate mounting and thermally processing a substrate thereon,
    said thermal processing plate being divided into a plurality of regions, and a temperature being capable of being set for each of the regions, and a temperature correction value for adjusting an in-plane temperature of said thermal processing plate being capable of being set by said temperature setting apparatus for each of the regions of said thermal processing plate, said temperature setting apparatus comprising:

a data storage unit storing, from states of an etching pattern within the substrate measured for a substrate for which a series of photolithography processing including the thermal processing on said thermal processing plate and an etching treatment thereafter have been finished, a function relating correction amounts for the states of the etching pattern to the temperature correction values for said thermal processing plate; and a program storage unit storing a program to calculate the temperature correction values for the regions of said thermal processing plate using the function, and set the temperature for each of the regions of said thermal processing plate by each of the calculated temperature correction values.

7. The temperature setting apparatus for a thermal processing plate as set forth in claim 6, wherein change amounts of the states of the etching pattern within the substrate when the temperature of one of the regions of said thermal processing plate is changed by 1° C. are obtained for each of the regions, and results thereof are expressed in a matrix to create the function.

8. The temperature setting apparatus for a thermal processing plate as set forth in claim 7, wherein the change amounts of the states of the etching pattern within the substrate in each of the regions when the temperature of one of the regions of said thermal processing plate is changed by 1° C. are expressed by a polynomial function, and coefficients of terms of the polynomial function are expressed in a matrix to create the function.

9. The temperature setting apparatus for a thermal processing plate as set forth in claim 6, wherein the thermal processing is heat-processing performed after exposure processing and before developing treatment in the photolithography processing.

10. The temperature setting apparatus for a thermal processing plate as set forth in claim 6, wherein the state of the etching pattern is at least any one of a line width, a film thickness, and a side wall angle of the etching pattern.

11. A non-transitory computer-readable storage medium storing a program running on a computer of a control unit controlling a temperature setting apparatus to cause the temperature setting apparatus to execute a temperature setting method for a thermal processing plate, the thermal processing plate being divided into a plurality of regions, and a temperature being capable of being set for each of the regions, and a temperature correction value for adjusting an in-plane temperature of the thermal processing plate being capable of being set for each of the regions of the thermal processing plate, said method comprising the steps of:

measuring states of an etching pattern within the substrate for a substrate for which a series of photolithography processing including the thermal processing on the thermal processing plate and an etching treatment thereafter have been finished;

calculating the temperature correction values for the regions of the thermal processing plate from measurement result of the states of the etching pattern within the substrate using a function between correction amounts for the states of the etching pattern and the temperature correction values for the thermal processing plate; and setting the temperature for each of the regions of the thermal processing plate by each of the calculated temperature correction values.

* * * * *